United States Patent
Noh et al.

(10) Patent No.: US 12,014,671 B2
(45) Date of Patent: Jun. 18, 2024

(54) GATE DRIVER, DISPLAY DEVICE INCLUDING THE SAME AND METHOD FOR OPERATING A GATE DRIVER

(71) Applicant: LG DISPLAY CO., LTD., Seoul (KR)

(72) Inventors: Junhwan Noh, Seoul (KR); Jaeyeong Ha, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/966,940

(22) Filed: Oct. 17, 2022

(65) Prior Publication Data

US 2023/0196984 A1  Jun. 22, 2023

(30) Foreign Application Priority Data

Dec. 16, 2021 (KR) .................. 10-2021-0180412

(51) Int. Cl.
- G09G 5/14 (2006.01)
- G09G 3/32 (2016.01)
- G09G 3/3233 (2016.01)
- G09G 3/3266 (2016.01)
- G09G 3/3275 (2016.01)

(52) U.S. Cl.
CPC ........ *G09G 3/32* (2013.01); *G09G 2300/0426* (2013.01); *G09G 2300/0842* (2013.01); *G09G 2310/0275* (2013.01); *G09G 2310/0278* (2013.01); *G09G 2330/021* (2013.01)

(58) Field of Classification Search
CPC ........................... G09G 3/3266; G09G 3/3233
See application file for complete search history.

(56) References Cited

U.S. PATENT DOCUMENTS

2009/0017569 A1* 1/2009 Moon .................. H01L 27/1248
                                                    438/30
2009/0303404 A1   12/2009 Kretz
2016/0155383 A1*  6/2016 Chen .................... G09G 3/3258
                                                    345/78

(Continued)

FOREIGN PATENT DOCUMENTS

CN    112838109 A    5/2021
JP    H1011026 A     1/1998

(Continued)

OTHER PUBLICATIONS

Japanese Office Action dated Sep. 12, 2023 issued in Patent Application No. 10-2022-186261 with English translation (6 pages).

*Primary Examiner* — Nan-Ying Yang
(74) *Attorney, Agent, or Firm* — POLSINELLI PC

(57) ABSTRACT

A gate driver includes a plurality of stages for sequentially supplying gate signals to a plurality of gate lines, each stage including an input circuit for receiving an (n−1)th gate signal carried through an (n−1)th gate line and a gate clock signal, and applying a first voltage and a second voltage having a polarity opposite to that of the first voltage to a Q node and a QB node, respectively; an output circuit for generating an n-th gate signal by outputting a low voltage corresponding to the first voltage or a high voltage corresponding to the second voltage, and outputting the generated n-th gate signal to an n-th gate line; and a stabilizing capacitor disposed between the n-th gate line and a high voltage source for supplying a high voltage.

19 Claims, 11 Drawing Sheets

(56) References Cited

U.S. PATENT DOCUMENTS

| | | |
|---|---|---|
| 2017/0162149 A1 | 6/2017 | Zhao et al. |
| 2018/0167070 A1* | 6/2018 | Kim ................ H03K 19/01742 |
| 2020/0357362 A1* | 11/2020 | Shin ..................... G09G 3/035 |
| 2023/0252945 A1 | 8/2023 | Yao et al. |

FOREIGN PATENT DOCUMENTS

| | | |
|---|---|---|
| JP | 2002287706 A | 10/2002 |
| JP | 2009508155 A | 2/2009 |

* cited by examiner

GATE DRIVER, DISPLAY DEVICE INCLUDING THE SAME AND METHOD FOR OPERATING A GATE DRIVER

CROSS-REFERENCE TO RELATED APPLICATION

This application claims the priority of Korea Patent Application No. 10-2021-0180412, filed on Dec. 16, 2021, which is hereby incorporated by reference in its entirety.

BACKGROUND

Field of the Disclosure

The present disclosure relates to display devices and methods of driving a display device, and more specifically, to a display device capable of reducing power consumption and improving the quality of images displayed, and a method of driving the display device.

Description of the Background

As the information-oriented society has been developed, various needs for display devices for displaying an image have increased. To satisfy such needs, various types of display devices, such as a liquid crystal display (LCD) device, an electroluminescence display (ELD) device, and the like have been developed and utilized.

The ELD device includes a quantum-dot light emitting display device including a quantum dot (QD), an inorganic light emitting display device, and an organic light emitting display device, and the like.

Such a display device can include a plurality of pixels arranged in a matrix form. The pixels can be each connected to a gate line and a data line and display images by sequentially receiving data signals in response to gate signals.

A circuit of each pixel included in the display device is becoming increasingly complex. Further, ripples occurring in gate signals supplied through gate lines by parasitic capacitors can lead image quality to be degraded. In particular, in the case of the electroluminescent display device, the degradation of the image quality can be prevented by allowing pixels to emit light after compensating for a difference in threshold voltages of driving transistors included in the pixels. The gate lines included in the display device can be affected by noises and driving signals, and in turn, ripples can easily occur in gate signals carried through the gate lines.

SUMMARY

Accordingly, the present disclosure is to provide a display device capable of preventing or reducing ripples that may occur in gate signals and the degradation of image quality, and a method of driving the display device as described above.

The present disclosure discussed below is not limited to solve the above issues, and further other issues not described above will become apparent to those skilled in the art from the following detailed description.

In an aspect of the present disclosure, a gate driver includes a plurality of stages for sequentially supplying gate signals to a plurality of gate lines, each of the plurality of stages including: an input circuit for receiving an (n−1)th gate signal carried through an (n−1)th gate line and a gate clock signal, and applying a first voltage and a second voltage having a polarity opposite to that of the first voltage to a Q node and a QB node, respectively; an output circuit for generating an n-th gate signal by outputting a low voltage or a high voltage corresponding to the first voltage and the second voltage, and outputting the generated n-th gate signal to an n-th gate line; and a stabilizing capacitor disposed between the n-th gate line and a high voltage source for supplying the high voltage.

In another aspect of the present disclosure, a display device includes a display panel including a plurality of data lines, a plurality of gate lines, a plurality of emission lines, and a plurality of pixels connected to the plurality of data lines, the plurality of gate lines, and the plurality of emission lines; a data driver for applying data signals to the plurality of data lines with being connected to the plurality of data lines; and a gate driver for respectively applying gate signals and emission signals to the plurality of gate lines and the plurality of emission lines with being connected to the plurality of gate lines and the plurality of emission lines. The gate driver includes a plurality of stages for sequentially supplying the gate signals to the plurality of gate lines, and each of the plurality of stages include: an input circuit for receiving an (n−1)th gate signal carried through an (n−1)th gate line and a gate clock signal, and applying a first voltage and a second voltage having a polarity opposite to that of the first voltage to a Q node and a QB node, respectively; an output circuit for generating an n-th gate signal by outputting a low voltage or a high voltage corresponding to the first voltage and the second voltage, and outputting the generated n-th gate signal to an n-th gate line; and a stabilizing capacitor disposed between the n-th gate line and a high voltage source for supplying the high voltage.

In the display device of the present disclosure, the degradation of image quality by reducing or preventing ripples that may occur in gate signals can be reduced or prevented.

The effects of the present disclosure are not limited to the above-mentioned effects. Further, aspects of the present disclosure are not limited to the above description, and other additional aspects, including variations thereof, will become apparent to those skilled in the art from the following detailed description.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
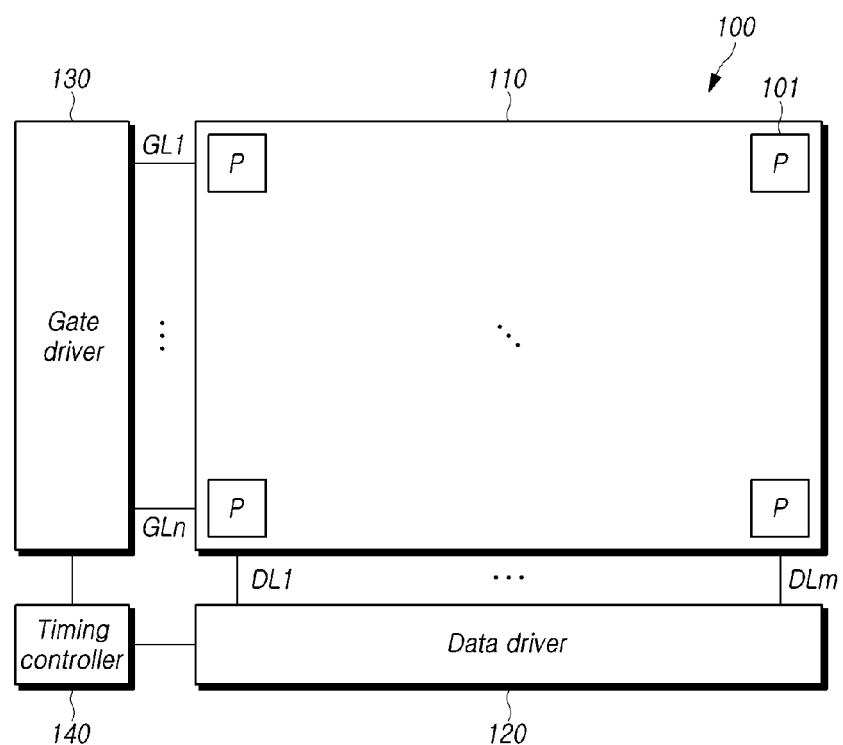
FIG. 1 illustrates a system configuration of a display device according to the present disclosure.

The advantages and features of the present disclosure and methods of achieving the same will be apparent by referring to aspects of the present disclosure as described below in detail in conjunction with the accompanying drawings. Aspects set forth below are described in the context of particular aspects, and provided only to completely disclose the present disclosure and inform those skilled in the art to which aspects according to the present disclosure pertains. However, it will be understood that these aspects may be implemented in various different forms, and in turn, many variations, modifications, additions, and improvements are possible. Therefore, the scope of the present disclosure is not limited to aspects described below, and should be defined by the scope of appended claims.

Shapes, sizes, ratios, angles, numbers, and the like illustrated in the accompanying drawings for describing aspects of the present disclosure are merely examples, and the present disclosure is not limited thereto. Like reference numerals generally denote like elements throughout the present specification. In the following description, detailed description of well-known functions and configurations incorporated herein will be omitted when it is determined that the description may make the subject matter in some aspects of the present disclosure rather unclear. The terms such as "including", "having", "containing", "comprising of", and "consist of" used herein are generally intended to allow other components to be added unless these terms are used with the term "only". Singular forms used herein are intended to include plural forms unless the context clearly indicates otherwise.

In interpreting any elements or features in the present disclosure, it should be interpreted that any dimensions and relative sizes of layers, areas and regions include a tolerance or error range even when a specific description is not given.

Spatially relative terms, such as "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as "directly", "only" are used.

Time relative terms, such as "after", "subsequent to", "next to", "before", or the like, used herein to describe a temporal relationship between events, operations, or the like are generally intended to include events, situations, cases, operations, or the like that do not occur consecutively unless the terms such as "directly", "only" are used.

When aspects related to signal flows are discussed, for example, an aspect where a signal is transmitted from node A to node B may include the transmission of the signal from node A to node B by way of another node the terms such as "directly", "only" are used.

When the terms, such as "first", "second", or the like, are used herein to describe various elements or components, it should be understood that these elements or components are not limited thereto. These terms are merely used herein for distinguishing an element from other elements. Therefore, a first element mentioned below may be a second element in a technical concept of the present disclosure.

The elements or features of various exemplary aspects of the present disclosure can be partially or entirely bonded to or combined with each other and can be interlocked and operated in technically various ways as can be fully understood by a person having ordinary skill in the art, and the various exemplary aspects can be carried out independently of or in association with each other.

A gate driver according to aspects of the present disclosure includes a plurality of stages for sequentially supplying gate signals to a plurality of gate lines.

Each of the plurality of stages can include an input circuit for receiving an (n−1)th gate signal carried through an (n−1)th gate line and a gate clock signal, and applying a first voltage and a second voltage having a polarity opposite to that of the first voltage to a Q node and a QB node, respectively, an output circuit for generating an n-th gate signal by outputting a low voltage or a high voltage corresponding to the first voltage and the second voltage, and outputting the generated n-th gate signal to an n-th gate line, and a stabilizing capacitor disposed between the n-th gate line and a high voltage source for supplying the high voltage.

The gate clock signal may maintain a low level during a first period in which the (n−1)th gate signal having the high voltage is input.

The input circuit may include a first input circuit for applying the first voltage to the Q node by the gate clock signal and the (n−1)th gate signal, and a second input circuit for applying the second voltage to the QB node in response to the (n−1)th gate signal.

The first input circuit may include a first switch including a first electrode, a second electrode, and a gate electrode that are connected to the (n−1)th gate line, the Q node, and a clock signal line for carrying a gate clock signal, respectively. The second input circuit may include a second switch including a first electrode, a second electrode, and a gate electrode that are connected to the clock signal line for carrying the gate clock signal, the QB node, and a first node, respectively, a third switch including a first electrode, a second electrode, and a gate electrode that are connected to the first node, a high voltage source, and the (n−1)th gate line, respectively, a fourth switch including a first electrode, a second electrode, and a gate electrode that are connected to the Q node, the high voltage source, and the QB node, respectively, and a first capacitor including a first electrode and a second electrode that are connected to the clock signal line and the first node, respectively.

The output circuit may include a first output circuit for selectively outputting a low voltage to the n-th gate line in response to the first voltage applied to the Q node, and a second output circuit for selectively outputting a high voltage to the n-th gate line in response to the second voltage applied to the QB node.

The first output circuit may include a fifth switch including a first electrode, a second electrode, and a gate electrode that are connected to a low voltage source, the n-th gate line, and the Q node, respectively. The second output circuit may include a sixth switch including a first electrode, a second electrode, and a gate electrode that are connected to the high voltage source, the n-th gate line, and the QB node, respectively, and a seventh switch including a first electrode, a second electrode, and a gate electrode that are connected to the gate of the sixth switch, the high voltage source, and the Q node, respectively.

A display device according to aspects of the present disclosure includes: a display panel including a plurality of data lines, a plurality of gate lines, a plurality of emission lines, and a plurality of pixels connected to the plurality of data lines, the plurality of gate lines, and the plurality of emission lines; a data driver for applying data signals to the plurality of data lines with being connected to the plurality of data lines; and a gate driver for respectively applying gate signals and emission signals to the plurality of gate lines and the plurality of emission lines with being connected to the plurality of gate lines and the plurality of emission lines. The gate driver includes a plurality of stages for sequentially supplying the gate signals to the plurality of gate lines, and each of the plurality of stages can include an input circuit for receiving an (n−1)th gate signal carried through an (n−1)th gate line and a gate clock signal, and applying a first voltage and a second voltage having a polarity opposite to that of the first voltage to a Q node and a QB node, respectively, an output circuit for generating an n-th gate signal by outputting a low voltage or a high voltage corresponding to the first voltage and the second voltage, and outputting the generated n-th gate signal to an n-th gate line, and a stabilizing capacitor disposed between the n-th gate line and a high voltage source for supplying the high voltage.

The gate clock signal may maintain a low level during a first period in which the (n−1)th gate signal having the high voltage is input.

The input circuit may include a first input circuit for applying the first voltage to the Q node by the (n−1)th gate signal and the gate clock signal, and a second input circuit for applying the second voltage to the QB node in response to the (n−1)th gate signal.

The first input circuit may include a first switch including a first electrode, a second electrode, and a gate electrode that are connected to the (n−1)th gate line, the Q node, and a clock signal line for carrying a gate clock signal, respectively. The second input circuit may include a second switch including a first electrode, a second electrode, and a gate electrode that are connected to the clock signal line for carrying the gate clock signal, the QB node, and a first node, respectively, a third switch including a first electrode, a second electrode, and a gate electrode that are connected to the first node, a high voltage source, and the (n−1)th gate line, respectively, a fourth switch including a first electrode, a second electrode, and a gate electrode that are connected to the Q node, the high voltage source, and the QB node, respectively, and a first capacitor including a first electrode and a second electrode that are connected to the clock signal line and the first node, respectively.

The output circuit may include a first output circuit for selectively outputting a low voltage to the n-th gate line in response to the first voltage applied to the Q node, and a second output circuit for selectively outputting a high voltage to the n-th gate line in response to the second voltage applied to the QB node.

The first output circuit may include a fifth switch including a first electrode, a second electrode, and a gate electrode that are connected to a low voltage source, the n-th gate line, and the Q node, respectively. The second output circuit may include a sixth switch including a first electrode, a second electrode, and a gate electrode that are connected to the high voltage source, the n-th gate line, and the QB node, respectively, and a seventh switch including a first electrode, a second electrode, and a gate electrode that are connected to the gate of the sixth switch, the high voltage source, and the Q node, respectively.

Each of the pixels may include a driving transistor for supplying a driving current to flow from a second node to a third node in response to a voltage at the first node, a light emitting element capable of emitting light by receiving the driving current, a storage capacitor that is disposed between the first node and a driving power supply line and is capable of maintaining the voltage of the first node, a first transistor for selectively electrically connecting the first node and the third node in response to a first gate signal, a second transistor for selectively transmitting a data signal to the second node in response to a second gate signal, a third transistor for selectively transmitting a driving voltage to the second node in response to an emission signal, a fourth transistor for electrically connecting the third node and the light emitting element in response to the emission signal, a fifth transistor for supplying a first initialization voltage to the third node by a third gate signal, and a sixth transistor for supplying a second initialization voltage to an anode electrode of the light emitting element by the third gate signal.

Hereinafter, with reference to the accompanying drawings, various aspects of the present disclosure will be described in detail.

FIG. 1 illustrates a system configuration of a display device according to the present disclosure.

Referring to FIG. 1, the display device 100 may include a display panel 110, a data driver 120, and a gate driver 130. The display device 100 may further include a timing controller 140.

The display panel 110 may include a plurality of data lines (DL1 to DLm) extending in a first direction and a plurality of gate lines (GL1 to GLn) extending in a second direction different from the first direction. The first direction and the second direction may be orthogonal to each other. However, aspects of the present disclosure are not limited thereto.

Further, the display panel 110 may include a plurality of pixels 101. The plurality of pixels 101 can enable images to be displayed on the display panel 110 by receiving data signals transmitted through the data lines (DL1 to DLm) in response to gate signals carried through the gate lines (GL1 to GLn). The plurality of pixels 101 can be initialized in response to the first initialization signal and the second initialization signal.

The data driver 120 may be connected to the plurality of data lines (DL1 to DLm) and can supply data signals to the plurality of pixels 101 through the data lines (DL1 to DLm). The data driver 120 may include a plurality of source drivers. The plurality of source drivers each may be implemented in an integrated circuit.

The gate driver 130 may be connected to the plurality of gate lines (GL1 to GLm) and can supply gate signals to the gate lines (GL1 to GLn). The data signals can be supplied to the pixels to which the gate signals are supplied through the gate lines.

Although FIG. 1 shows that the gate driver 130 is located outside of the display panel 110, the present disclosure is not limited thereto. For example, the gate driver 130 may be disposed in the display panel 110. Further, the gate driver 130 may be disposed on the display panel 110 and include a gate signal generator for outputting one or more gate signals and one or more level shifters for supplying one or more voltages and one or more clocks to the gate signal generator. Further, the gate driver 130 may be implemented with a plurality of integrated circuits.

Although FIG. 1 shows that the gate driver 130 is located on one side or edge of the display panel 110, the present disclosure is not limited thereto. For example, gate drivers 130 may be disposed in two sides or edges of display panel 110, such as left and right sides or edges, top and bottom sides or edges, or the like. Further, the gate driver disposed on the left side or edge of the display panel 110 may be connected to odd-numbered gate lines, and the gate driver disposed on the right side or edge thereof may be connected to even-numbered gate lines.

The gate driver 130 can sequentially supply an emission signal and an initialization signal to the plurality of pixels.

The timing controller 140 can control the data driver 120 and the gate driver 130. The timing controller 140 can supply a data control signal to the data driver 120 and a data driver control signal to the gate driver 130. The data control signal and the gate control signal may include a clock, a vertical synchronization signal, a horizontal synchronization signal, and a start pulse etc. However, signals supplied from the timing controller 140 according to aspects of the present disclosure are not limited thereto.

The timing controller 140 can supply image signals to the data driver 120. The data driver 120 can generate data signals using image signals and one or more data control signals received from the timing controller 140, and output the generated data signals to the data lines (DL1 to DLm).

Figure 2:
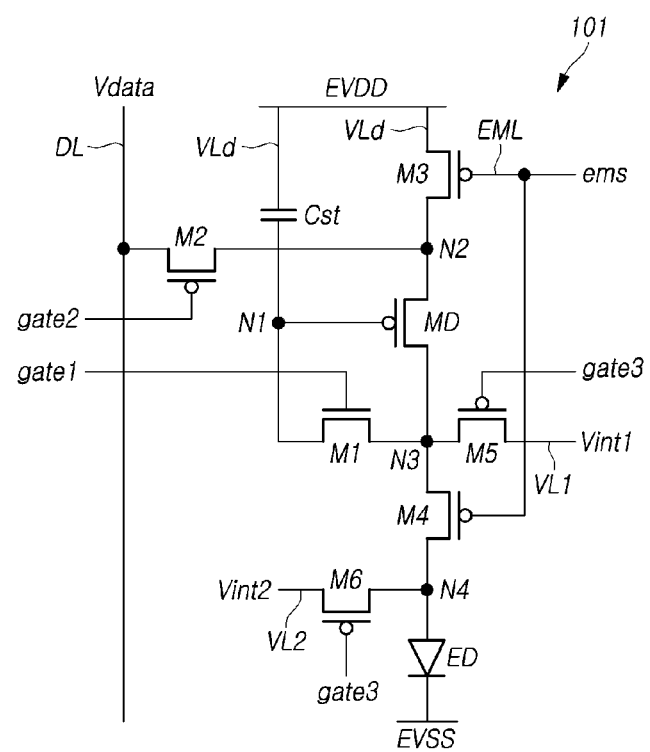
FIG. 2 is a circuit diagram of a pixel used in the display device according to the present disclosure.

FIG. 2 is a circuit diagram of a pixel used in the display device according to the present disclosure.

Referring to FIG. 2, the pixel 101 may include a driving transistor MD, a light emitting element ED, and a storage capacitor Cst.

The driving transistor MD can generate a driving current to flow from a second node N2 to a third node N3 in response to a voltage at a first node N1. A voltage transmitted to the first node N1 may be a voltage obtained by adding a voltage level of the threshold voltage of the driving transistor MD to, or subtracting the voltage level of the threshold voltage of the driving transistor MD from, a voltage level of a data signal Vdata.

The driving transistor MD may have a first electrode, a second electrode, and a gate electrode that are connected to the second node N2, the third node N3, and the first node N1, respectively. Further, a data signal Vdata can be selectively transmitted to the second node N2, and the data signal Vdata transmitted to the second node N2 can be transmitted to the first node N1 via the third node N3. The driving transistor MD may be an n-type MOS transistor.

The driving transistor MD can enable a driving current to flow from the second node N2 to the third node N3 in response to the data signal Vdata transmitted to the first node N1.

The light emitting element ED ca emit light by receiving the driving current flowing from the second node N2 to the third node N3. The light emitting element ED may include an anode electrode, a cathode electrode, and an emissive layer disposed between the anode electrode and the cathode electrode.

In a situation where a second driving voltage EVSS having a low level is applied to the cathode electrode of the light emitting element ED, if a voltage having a high level is applied to the anode electrode, a current can flow from the anode electrode to the cathode electrode of the light emitting device ED. The light emitting element ED can emit light by a current flowing from the anode electrode to the cathode electrode.

The light emitting element ED may be, for example, an organic light emitting diode (OLED), an inorganic light emitting diode, a quantum dot light emitting element, or the like. In a case where an organic light emitting diode is used as the light emitting element ED, the emissive layer EL thereof may include an organic emissive layer including an organic material.

The storage capacitor Cst can enable a voltage at the first node N1 to be maintained. The storage capacitor Cst may be disposed between the first node N1 and a driving power supply line VLd for supplying a driving voltage EVDD.

The pixel 101 may include a first transistor M1, a second transistor M2, a third transistor M3, a fourth transistor M4, a fifth transistor M5, and a sixth transistor M6.

The first transistor M1 can cause the driving transistor MD to become a diode-connected state. The first transistor M1 may include a first electrode, a second electrode, and a gate electrode that are connected to the first node N1, the third node N3, and a first gate line GL1, respectively. The first transistor M1 can be turned on/off in response to a first gate signal gate1 transmitted through the first gate line GL1.

The second transistor M2 can selectively transmit a data signal Vdata supplied through the data line DL to the second node N2. The second transistor M2 may include a first electrode, a second electrode, and a gate electrode that are connected to the data line DL, the second node N2, and a second gate line GL2, respectively. The second transistor M2 can be turned on/off in response to a second gate signal gate2 transmitted through the second gate line GL2.

The third transistor M3 can selectively transmit a driving voltage EVDD to the second node N2. The third transistor M3 may include a first electrode, a second electrode, and a gate electrode that are connected to a driving power supply line VLd for supplying the driving voltage EVDD, the second node N2, and an emission line EML, respectively. The third transistor M3 can be turned on/off in response to an emission signal ems transmitted through the emission line EML.

The fourth transistor M4 can selectively transmit a driving current flowing through the driving transistor MD to the light emitting element ED. The fourth transistor M4 may include a first electrode, a second electrode, and a gate electrode that are connected to the third node N3, the anode electrode of the light emitting element ED, and the emission line EML, respectively. The fourth transistor M4 can be turned on/off in response to the emission signal ems transmitted through the emission line EML.

The fifth transistor M5 can selectively transmit a first initialization voltage Vint1 to the third node N3. The fifth transistor M5 may include a first electrode, a second electrode, and a gate electrode that are connected to a first initialization voltage line VL1 for transmitting the first initialization voltage Vint1, the third node N3, and a third gate line GL3, respectively. The fifth transistor M5 can be turned on/off in response to a third gate signal gate3 transmitted through the third gate line GL3. The fifth transistor M5 may have a double gate structure, thereby reducing the occurrence of a leakage current and preventing a decrease in the voltage of the third node N3.

A voltage level of the first initialization voltage Vint1 may be higher than a voltage level of the driving voltage in a predefined period. In a situation where the first initialization voltage Vint1 having a level higher than the driving voltage is transmitted to the driving transistor MD, hysteresis of the driving transistor MD can be cured.

The sixth transistor M6 can selectively transmit a second initialization voltage Vint2 to the anode electrode of the light emitting device ED. The sixth transistor M6 may include a first electrode, a second electrode, and a gate electrode that are connected to a second initialization voltage line VL2 for transmitting the second initialization voltage Vint2, the anode electrode of the light emitting device ED, and the third gate line GL3, respectively. The sixth transistor M6 can be turned on/off in response to the third gate signal gate3 transmitted through the third gate line GL3. A voltage level of the second initialization voltage Vint2 may be lower than a threshold voltage of the light emitting device ED.

Here, the first transistor M1 may be a p-type MOS transistor, and the driving transistor MD and the second to sixth transistors M2 to M6 may be n-type MOS transistors, or all transistors may be p-type MOS transistors or n-type MOS transistors. However, aspects of the present disclosure are not limited thereto. Further, the first transistor M1, or all transistors, may be an oxide semiconductor transistor in which the active layer includes an oxide semiconductor, and the active layers of the driving transistor MD and the second to sixth transistors M2 to M6, or all transistors, may include low-temperature polysilicon.

Figure 3A:
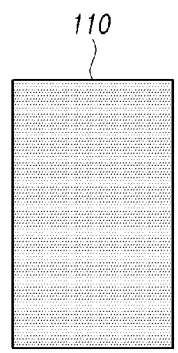
FIGS. 3A and 3B illustrate that images are displayed on a display panel employed in the display device of FIG. 1.
Figure 3B:
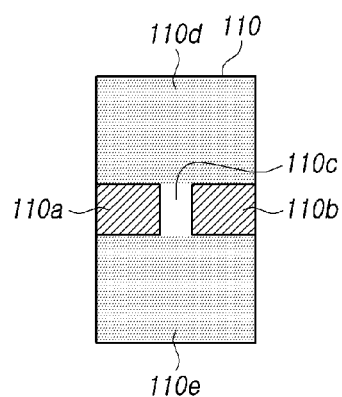

FIGS. 3A and 3B illustrate that images are displayed on the display panel employed in the display device of FIG. 1.

FIG. 3A illustrates that only gray is displayed on the whole of the display panel 110. FIG. 3B illustrates that black is displayed in first and second regions (110a and 110b) of the display panel 110, and gray is displayed in third to fifth regions (110c to 110e).

In a situation where only gray is displayed on the whole of the display panel 110 as shown in FIG. 3A, the overall luminance of the display panel 110 is maintained constant. However, in a situation where the display panel 110 displays an image as shown in FIG. 3B, the third region 110c disposed between the first and second regions (110a and 110b) displaying black represents luminance higher than the fourth or fifth region (110d or 110e) displaying the gray.

Figure 4:
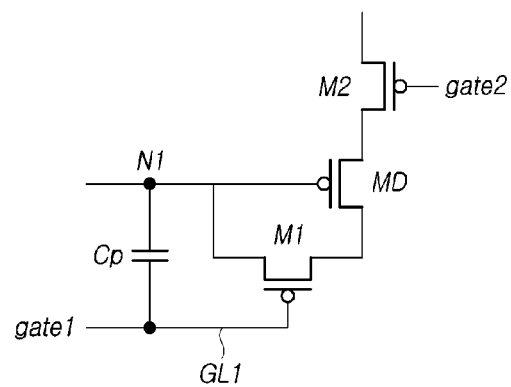
FIG. 4 is a partial circuit diagram illustrating only the connections of a driving transistor, a first transistor, and a second transistor included in the pixel shown in FIG. 2.
Figure 5:
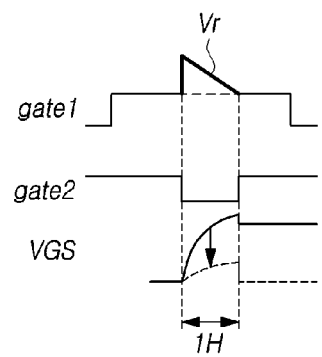
FIG. 5 is a timing diagram illustrating waveforms of a first gate signal and a second gate signal applied to the pixel.

FIG. 4 is a partial circuit diagram illustrating only the connections of the driving transistor, the first transistor, and the second transistor included in the pixel shown in FIG. 2. FIG. 5 is a timing diagram illustrating waveforms of a first gate signal and a second gate signal applied to the pixel.

Referring to FIG. 4, a parasitic capacitor Cp may be formed between the first node N1 and the first gate line GL1. When the first transistor M1 and the second transistor M2 are turned on in the pixel 101 disposed in the first region 110a and the third region 110c, a data signal Vdata transmitted through the data line DL can be applied to the first node N1 by the operation of the second transistor M2 and the first transistor M1.

Since the data signal Vdata supplied to the pixel 101 disposed in the first region 110a corresponds to black, and the data signal Vdata supplied to the pixel 101 disposed in the third region 110c corresponds to gray, a voltage level of the data signal supplied to the pixel 101 disposed in the first region 110a is higher than a voltage level of the data signal supplied to the pixel 101 disposed in the third region 110c.

Referring to FIG. 5, when a voltage corresponding to the data signal is applied to the first node N1 of the pixel 101, the second gate signal gate2 has a low level while the first gate signal gate1 has a high level. In this case, a time period in which the second gate signal gate2 maintains the low level may be as short as about one horizontal period (1H).

When a data signal Vdata is applied to the first node N1 of the pixel 101 by the first gate signal gate1, a voltage at the first node N1 can rise by the data signal Vdata. At this time, the parasitic capacitor Cp can also cause the voltage on the first gate line GL1 to rise. Further, as time passes, the voltage on the first gate line GL1 can fall. As a result, as shown in FIG. 5, this causes a ripple Vr to occur in the first gate signal gate1.

In a situation where a data signal corresponding to black is applied to the pixel 101 of the first region 110a and a data signal corresponding to gray is applied to the third region 110c, the data signal corresponding to the black and the parasitic capacitor Cp can cause a voltage on the first gate line GL1 in the pixel 101 of the first region 110a to rise. Further, as time passes, the voltage on the first gate line GL1 can fall again. When the data signal corresponding to gray is applied to the pixel of the third region 110c as the voltage on the first gate line GL1 falls, a voltage lower than a predefined voltage may be applied to the first node N1 of the pixel of the third region 110c.

Accordingly, a voltage lower than the predefined voltage, i.e., a voltage VGS as represented by a dotted line, can be applied between the source electrode and the gate electrode of the driving transistor MD.

The voltage VGS between the source and gate electrodes of the driving transistor MD of the pixel of the third region 110c, which is lower than the predefined voltage, causes luminance of the pixel 101 to increase. Accordingly, display non-uniformity may be present such that the third region 110c is displayed brighter than the fourth region 110d and the fifth region 110e even though the third region 110c displays the gray that the fourth region 110d and the fifth region 110e display.

Figure 6:
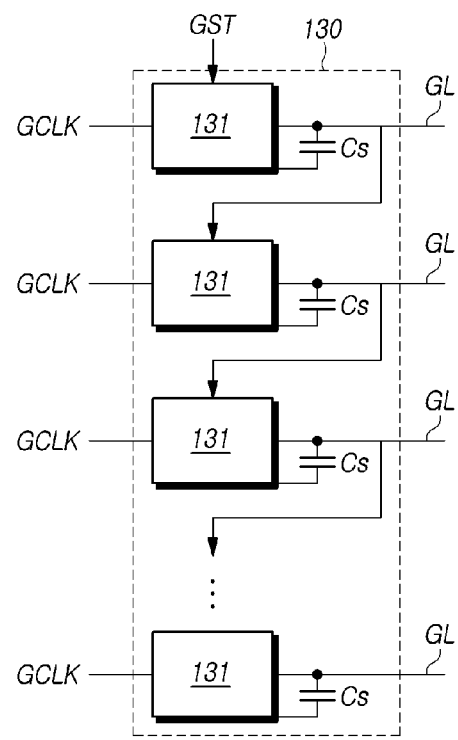
FIG. 6 illustrates a gate driver according to the present disclosure.
Figure 7:
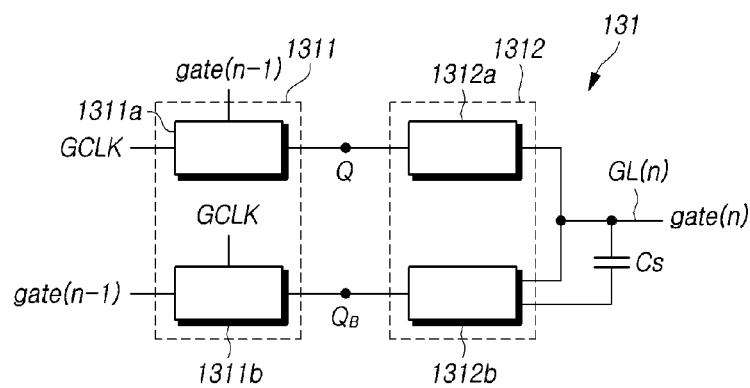
FIG. 7 illustrates one of a plurality of stages shown in FIG. 6.

FIG. 6 illustrates the gate driver according to aspects of the present disclosure, and FIG. 7 illustrates one of a plurality of stages shown in FIG. 6.

Referring to FIGS. 6 and 7, the gate driver 130 may include a plurality of stages 131s that sequentially transmit gate signals to a plurality of gate lines GLs.

A first stage can receive a start pulse GST and a gate clock signal GCLK and thereby output a gate signal. Further, each of the remaining stages including a second stage can receive a previous gate signal from a gate line connected to a previous stage and output a gate signal using the clock signal and the previous gate signal. Accordingly, the plurality of stages 131s can sequentially output respective gate signals.

Further, each stage 131, in which a stabilizing capacitor Cs is connected to a respective gate line, can enable a gate signal output from the respective gate line to be stably outputted.

As shown in FIG. 7, each of the plurality of stages 131s may include an input circuit 1311 for receiving an (n−1)th gate signal gate(n−1) supplied through an (n−1)th gate line and a gate clock signal GCLK, and applying a first voltage and a second voltage having a polarity different from that of the first voltage to the Q node Q and the QB node QB, respectively, and an output circuit 1312 for generating an n-th gate signal gate(n) by outputting a low voltage or a high voltage corresponding to the first voltage and the second voltage, and outputting the generated n-th gate signal gate(n) to an n-th gate line GL(n), and a stabilizing capacitor Cs disposed between the n-th gate line GL(n) and the output circuit 1312.

A plurality of gate lines may be disposed in the display device and include the (n−1)th gate line and the n-th gate line. The (n−1)th gate line may be a gate line to which the (n−1)th gate signal gate(n−1) output from the (n−1)th stage of the plurality of stages is output, and the n-th gate line may be a gate line to which the n-th gate signal gate(n) output from the n-th stage of the plurality of stages is output.

As a high voltage is maintained on the gate line GL by the stabilizing capacitor, a gate signal can be stably driven on the gate line GL, thereby the occurrence of ripples in the gate signal can be effectively prevented. Accordingly, as shown in FIG. 5, it is possible to prevent or reduce the increase of luminance in the third region 110c.

Figure 8:
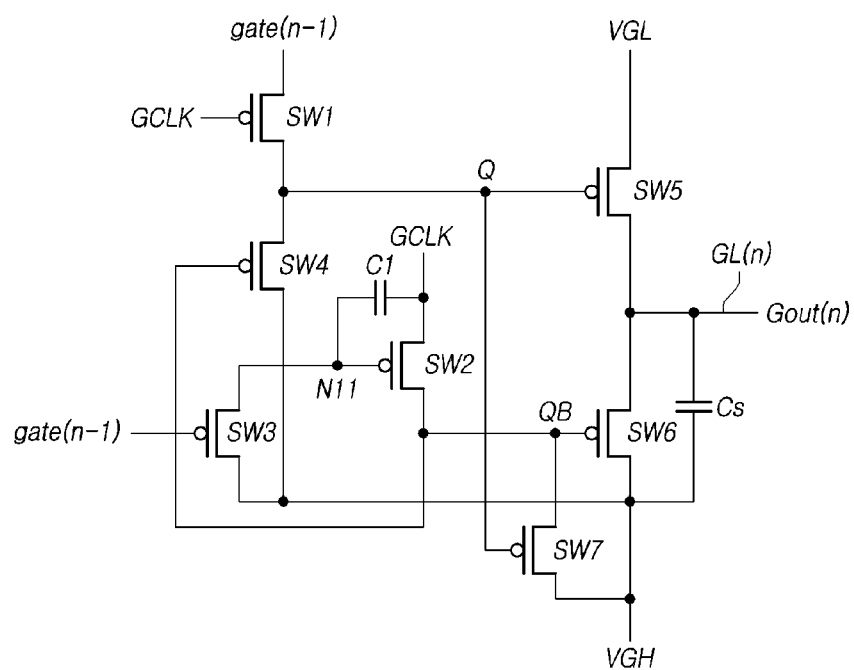
FIG. 8 is a circuit diagram illustrating the stage shown in FIG. 6.

FIG. 8 is a circuit diagram illustrating the stage shown in FIG. 6.

Referring to FIGS. 7 and 8, the stage 131 may include a first input circuit 1311a for enabling the first voltage to be applied to the Q node Q by the gate clock signal GCLK and the (n−1)th gate signal gate(n−1), and a second input circuit 1311b for enabling the second voltage to be applied to the QB node QB in response to the (n−1)th gate signal gate(n−1). The first voltage and the second voltage may have opposite polarities. Accordingly, when the first voltage has the voltage of a high level, the second voltage can have the voltage of a low level, and when the first voltage has the voltage of the low level, the second voltage can have the voltage of the high level.

Further, the stage 131 may include a first output circuit 1312a for selectively outputting a low voltage VGL to the n-th gate line in response to the first voltage transmitted to the Q node Q, and a second output circuit 1312b for selectively outputting a high voltage VGH to the n-th gate line in response to the second voltage transmitted to the QB node QB.

The first input circuit 1311a may include a first switch SW1 including a first electrode, a second electrode, and a gate electrode that are connected to the (n−1)th gate line for supplying the (n−1)th gate signal gate(n−1), the Q node Q, and a clock signal line for supplying the gate clock signal GCLK, respectively. Here, the (n−1)th gate signal gate(n−1) may be a gate signal output from a previous stage.

The second input circuit 1311b may include a second switch SW2 including a first electrode, a second electrode, and a gate electrode that are connected to the clock signal line for supplying the gate clock signal GCLK, the QB node QB, and a first node N11, respectively, a third switch SW3 including a first electrode, a second electrode, and a gate electrode that are connected to the first node N11, a high voltage source VGH, and the (n−1)th gate line, respectively, a fourth switch SW4 including a first electrode, a second electrode, and a gate electrode that are connected to the Q node Q, the high voltage source VGH for supplying a high voltage, and the QB node QB, respectively, and a first capacitor C1 including a first electrode and a second electrode that are connected to the clock signal line for supplying the gate clock signal GCLK and the gate electrode of the second switch SW2, respectively.

The first output circuit 1312a may include a fifth switch SW5 including a first electrode, a second electrode, and a gate electrode that are connected to a low voltage source for supplying a low voltage VGL, the n-th gate line, and the Q node Q, respectively. The second output circuit 1312b may include a sixth switch SW6 including a first electrode, a second electrode, and a gate electrode that are connected to the high voltage source for supplying the high voltage VGH, the n-th gate line, and the QB node QB, respectively, and a seventh switch SW7 including a first electrode, a second electrode, and a gate electrode that are connected to the gate of the sixth switch SW6, the high voltage source for supplying the high voltage VGH, and the Q node Q, respectively.

The n-th gate line GL(n) refers to a gate line for supplying the n-th gate signal gate(n) output in this stage to the pixel 101 illustrated in FIG. 2. The n-th gate signal gate(n) refers to a gate signal applied to the gate electrode of the first transistor M1 of the pixel 101 shown in FIG. 2.

The first to seventh switches (SW1 to SW7) may be, for example, n-type MOS transistors. The active layers of the first to seventh switches (SW1 to SW7) may include, for example, low-temperature polysilicon.

Figure 9A:
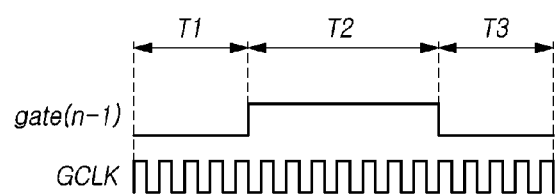
FIGS. 9A and 9B are waveform diagrams illustrating an example gate signal and an example gate clock signal input to the stage shown in FIG. 8.
Figure 9B:
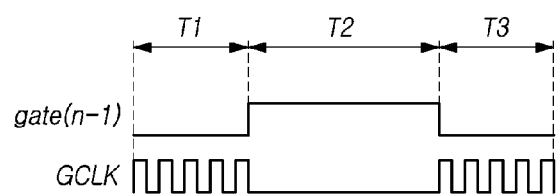

FIGS. 9A and 9B are waveform diagrams illustrating an example gate signal and an example gate clock signal input to the stage shown in FIG. 8.

Referring to FIG. 9A, the stage 130 can receive the (n−1)th gate signal G(n−1) having a low level in a first period T1, the (n−1)th gate signal having a high level in a second period T2, and the (n−1)th gate signal G(n−1) having the low level in a third period T3. Further, in each of the first to third periods (T1 to T3), a gate clock signal GCLK may repeat a high level and a low level several times.

In the first period T1, the (n−1)th gate signal G(n−1) having the low level may be supplied. The gate clock signal GCLK can repeat the low level and the high level one or more times. When the gate clock signal GCLK has the low level, the first switch SW1 can be turned on. When the first switch SW1 is turned on, the first voltage having a low level can be applied to the Q node Q by an (n−1)th gate signal G(n−1).

As the (n−1)th gate signal G(n−1) having the low level is applied to the gate electrode of the third switch SW3, the third switch SW3 can be turned on. When the third switch SW3 is turned on, a high voltage VGH can be transmitted to the gate of the second switch SW2. The second switch SW2 is in the off-state.

When the first voltage having the low level is applied to the Q node Q, the fifth switch SW5 can be turned on, and a low voltage VGL can be transmitted to the n-th gate line GL(n). Further, as the seventh switch SW7 is turned on by the first voltage having the low level applied to the Q node Q, the high voltage VGH can be transmitted to the QB node QB, and the second voltage having a high level can be applied to the QB node QB.

The sixth switch SW6 can be turned off by the second voltage having the high level applied to the QB node QB, and thereby, the high voltage VGH cannot be transmitted to the n-th gate line GL(n).

In the second period T2, the (n−1)th gate signal gate(n−1) having the high level can be transmitted, and the gate clock signal GCLK, which repeats the low level and the high level one or more times, that has the low level can be transmitted. The first switch SW1 can be turned on by the gate clock signal GCLK having the low level, and thereby, the (n−1)th gate signal gate(n−1) having the high level can be transmitted to the Q node Q.

Further, as the (n−1)th gate signal G(n−1) having the high level is applied to the gate electrode of the third switch SW3, the third switch SW3 can be turned off. Accordingly, the gate electrode of the second switch SW2 can become a floating state. When the gate clock signal GCLK is changed from the high level to the low level after the gate electrode of the second switch SW2 becomes the floating state, a voltage at the gate electrode of the second switch SW2 can fall by the first capacitor C1, and the second switch SW2 can be turned on. At this time, since the gate clock signal GCLK has the low level, the second voltage having the low level can be applied to the QB node QB.

When the second voltage having the low level is applied to the QB node QB, the second voltage having the low level can be applied to the gate electrode of the fourth switch SW4, and thereby, the fourth switch SW4 can be turned on. When the fourth switch SW4 is turned on, the high voltage can be applied to the Q node Q, and the first voltage having the high level can be applied to the Q node Q.

In the second period T2, since the first voltage having the high level is applied to the Q node Q, and the second voltage having the low level is applied to the QB node QB, the fifth switch SW5 can be turned off, and the sixth switch SW6 can be turned on. Further, the seventh switch SW7 can be turned off. Accordingly, the n-th gate signal G(n) having the high level can be output to the n-th gate line GL(n).

Further, in the second period T2, as the gate clock signal GCLK is changed from the low level to the high level again, when a voltage at the gate electrode of the second switch SW2 rises and the second switch SW2 is turned off, the QB node QB can become the floating state and maintain the second voltage having the low level. Therefore, even when the gate clock signal GCLK repeats the high level and the low level several times in the second period T2, the n-th gate signal gate(n) having the high level can be continually output to the n-th gate line GL(n).

In the third period T3, the (n−1)th gate signal G(n−1) having the low level can be supplied. When the gate clock signal GCLK, which repeats the low level and the high level one or more times, has the low level, the first switch SW1 can be turned on. When the first switch SW1 is turned on, the first voltage having the low level can be applied to the Q node Q by an (n−1)th gate signal G(n−1).

Further, when the (n−1)th gate signal gate(n−1) having the low level is applied to the gate electrode of the third switch SW3, the third switch SW3 can be turned on. When the third switch SW3 is turned on, the high voltage VGH is transmitted to the gate of the second switch SW2, and the second switch SW2 can be turned off. Accordingly, the QB node QB becomes the floating state. In the second period T2, as the QB node QB maintains the second voltage having the low level, the QB node QB can remain the previous state, and the second voltage having the high level can be applied to the QB node QB.

When the first voltage having the low level is applied to the Q node Q, the fifth switch SW5 can be turned on, and the low voltage can be transmitted to the n-th gate line. When the second voltage having the high level is applied to the QB node QB, the sixth switch SW6 can be turned off, and the high voltage cannot be transmitted to the n-th gate line.

At this time, the stabilizing capacitor Cs may be disposed between the high voltage source for transmitting the high voltage VGH and the n-th gate line G(n). Accordingly, when the n-th gate line G(n) outputs the high voltage VGH as the n-th gate signal, the output can be stabilized by the stabilizing capacitor Cs, and thus, ripples that may occur in the first gate signal can be prevented or reduced while a data signal is input to the first node N11 of the pixel 101 illustrated in FIG. 2.

Further, as shown in FIG. 9B, the gate clock signal GCLK can maintain the low level during the second period T2 in which the (n−1)th gate signal G(n−1) maintains the high level. When the gate clock signal GCLK maintains the low level, the first switch SW1 remains turned on without repeating turn-on and turn-off. Thereby, the fifth switch SW5 remains turned off and at the same time, the second switch SW2 remains turned on without repeating turn-on and turn-off by the gate clock signal GCLK input to the second switch SW2. Therefore, the occurrence of ripples in the second voltage having the low level applied to the QB node QB can be prevented or reduced.

Accordingly, the occurrence of ripples in the n-th gate signal gate(n) can be prevented or reduced as the high voltage continuously drives the n-th gate line Gn.

The (n−1)th gate signal may correspond to the first gate signal carried through the first gate line GL1 input to the gate electrode of the first transistor M1 in the pixel 101 shown in FIG. 2.

Although the stage configured to receive the (n−1)th gate signal gate(n−1) is illustrated, when the stage is a first stage outputting a first gate signal among the plurality of stages, a start pulse GST instead of the (n−1)th gate signal gate (n−1) may be supplied to the stage corresponding to the first stage.

The above description has been presented to enable any person skilled in the art to make and use the disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. Although the exemplary aspects have been described for illustrative purposes, a person skilled in the art will appreciate that various modifications and applications are possible without departing from the essential characteristics of the present disclosure. For example, the specific components of the exemplary aspects may be variously modified. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure is to be construed according to the claims, and all technical ideas within the scope of the claims should be interpreted as being included in the scope of the present disclosure.

What is claimed is:

1. A gate driver comprising:
a plurality of stages configured to sequentially supply gate signals to a plurality of gate lines, each of the plurality of stages comprising:
an input circuit configured to receive an (n−1)th gate signal carried through an (n−1)th gate line and a gate clock signal, and applying a first voltage and a second voltage having a polarity opposite to a polarity of the first voltage to a Q node and a QB node, respectively;
an output circuit configured to generate an n-th gate signal by outputting a low voltage corresponding to the first voltage or a high voltage corresponding to the second voltage, and outputting the generated n-th gate signal to an n-th gate line; and
a stabilizing capacitor disposed between the n-th gate line and a high voltage source for supplying the high voltage,
wherein the stabilizing capacitor is directly connected to the high voltage source, and
wherein the high voltage source supplies the high voltage to the stabilizing capacitor continuously.

2. The gate driver according to claim 1, wherein the gate clock signal maintains a low level during a first period in which the (n−1)th gate signal having the high voltage is input.

3. The gate driver according to claim 1, wherein the input circuit comprises:
a first input circuit configured to supply the first voltage to the Q node in response to the gate clock signal and the (n−1)th gate signal; and
a second input circuit configured to supply the second voltage to the QB node in response to the (n−1)th gate signal.

4. The gate driver according to claim 3, wherein the first input circuit comprises a first switch including a first electrode, a second electrode, and a gate electrode that are connected to the (n−1)th gate line, the Q node, and a clock signal line for carrying the gate clock signal, respectively.

5. The gate driver according to claim 4, wherein the second input circuit comprises:
   a second switch including a first electrode, a second electrode, and a gate electrode that are connected to the clock signal line for carrying the gate clock signal, the QB node, and a first node, respectively;
   a third switch including a first electrode, a second electrode, and a gate electrode that are connected to the first node, the high voltage source, and the (n−1)th gate line, respectively;
   a fourth switch including a first electrode, a second electrode, and a gate electrode that are connected to the Q node, the high voltage source, and the QB node, respectively; and
   a first capacitor including a first electrode and a second electrode that are connected to the clock signal line and the first node, respectively.

6. The gate driver according to claim 1, wherein the output circuit comprises:
   a first output circuit configured to selectively output the low voltage to the n-th gate line in response to the first voltage applied to the Q node; and
   a second output circuit configured to selectively output the high voltage to the n-th gate line in response to the second voltage applied to the QB node.

7. The gate driver according to claim 6, wherein the first output circuit comprises a fifth switch including a first electrode, a second electrode, and a gate electrode that are connected to a low voltage source, the n-th gate line, and the Q node, respectively.

8. The gate driver according to claim 7, wherein the second output circuit comprises:
   a sixth switch including a first electrode, a second electrode, and a gate electrode that are connected to the high voltage source, the n-th gate line, and the QB node, respectively; and
   a seventh switch including a first electrode, a second electrode, and a gate electrode that are connected to the gate electrode of the sixth switch, the high voltage source, and the Q node, respectively.

9. A display device comprising:
   a display panel including a plurality of data lines, a plurality of gate lines, a plurality of emission lines, and a plurality of pixels connected to the plurality of data lines, the plurality of gate lines, and the plurality of emission lines;
   a data driver for applying data signals to the plurality of data lines with being connected to the plurality of data lines; and
   a gate driver configured to respectively supply gate signals and emission signals to the plurality of gate lines and the plurality of emission lines with being connected to the plurality of gate lines and the plurality of emission lines,
   wherein the gate driver comprises:
   a plurality of stages configured to sequentially supply the gate signals to the plurality of gate lines, each of the plurality of stages comprises:
   an input circuit configured to receive an (n−1)th gate signal carried through an (n−1)th gate line and a gate clock signal, and applying a first voltage and a second voltage having a polarity opposite to a polarity of the first voltage to a Q node and a QB node, respectively;
   an output circuit configured to generate an n-th gate signal by outputting a low voltage corresponding to the first voltage or a high voltage corresponding to the second voltage, and outputting the generated n-th gate signal to an n-th gate line; and
   a stabilizing capacitor disposed between the n-th gate line and a high voltage source for supplying the high voltage,
   wherein the stabilizing capacitor is directly connected to the high voltage source, and
   wherein the high voltage source supplies the high voltage to the stabilizing capacitor continuously.

10. The display device according to claim 9, wherein the gate clock signal maintains a low level during a first period in which the (n−1)th gate signal having the high voltage is input.

11. The display device according to claim 9, wherein the input circuit comprises:
    a first input circuit for applying the first voltage to the Q node in response to the (n−1)th gate signal and the gate clock signal; and
    a second input circuit for applying the second voltage to the QB node in response to the (n−1)th gate signal.

12. The display device according to claim 11, wherein the first input circuit comprises:
    a first switch including a first electrode, a second electrode, and a gate electrode that are connected to the (n−1)th gate line, the Q node, and a clock signal line for carrying the gate clock signal, respectively.

13. The display device according to claim 12, wherein the second input circuit comprises:
    a second switch including a first electrode, a second electrode, and a gate electrode that are connected to the clock signal line for carrying the gate clock signal, the QB node, and a first node, respectively;
    a third switch including a first electrode, a second electrode, and a gate electrode that are connected to the first node, the high voltage source, and the (n−1)th gate line, respectively;
    a fourth switch including a first electrode, a second electrode, and a gate electrode that are connected to the Q node, the high voltage source, and the QB node, respectively; and
    a first capacitor including a first electrode and a second electrode that are connected to the clock signal line and the first node, respectively.

14. The display device according to claim 9, wherein the output circuit comprises:
    a first output circuit for selectively outputting the low voltage to the n-th gate line in response to the first voltage applied to the Q node; and
    a second output circuit for selectively outputting the high voltage to the n-th gate line in response to the second voltage applied to the QB node.

15. The display device according to claim 14, wherein the first output circuit comprises a fifth switch including a first electrode, a second electrode, and a gate electrode that are connected to a low voltage source, the n-th gate line, and the Q node, respectively.

16. The display device according to claim 14, the second output circuit comprises:
    a sixth switch including a first electrode, a second electrode, and a gate electrode that are connected to the high voltage source, the n-th gate line, and the QB node, respectively; and
    a seventh switch including a first electrode, a second electrode, and a gate electrode that are connected to the gate electrode of the sixth switch, the high voltage source, and the Q node, respectively.

17. The display device according to claim 9, wherein each of the plurality of pixels comprises:
a driving transistor configured to supply a driving current to flow from a second node to a third node in response to a voltage at a first node,
a light emitting element capable of emitting light by receiving the driving current;
a storage capacitor that is disposed between the first node and a driving power supply line and is capable of maintaining the voltage of the first node;
a first transistor configured to electrically connect the first node and the third node in response to a first gate signal;
a second transistor configured to selectively transmit a data signal to the second node in response to a second gate signal;
a third transistor configured to selectively transmit a driving voltage to the second node in response to an emission signal;
a fourth transistor configured to electrically connect the third node and the light emitting element in response to the emission signal;
a fifth transistor configured to supply a first initialization voltage to the third node by a third gate signal; and
a sixth transistor configured to supply a second initialization voltage to an anode electrode of the light emitting element by the third gate signal.

18. The display device according to claim 9, further comprising a timing controller supplying a data control signal to the data driver and a data driver control signal to the gate driver.

19. A method for operating the gate driver including a plurality of stages configured to sequentially supply gate signals to a plurality of gate lines, each of the plurality of stages including an input circuit configured to receive an (n−1)th gate signal carried through an (n−1)th gate line and a gate clock signal, and applying a first voltage and a second voltage having a polarity opposite to a polarity of the first voltage to a Q node and a QB node, respectively; an output circuit configured to generate an n-th gate signal by outputting a low voltage corresponding to the first voltage or a high voltage corresponding to the second voltage, and outputting the generated n-th gate signal to an n-th gate line; and a stabilizing capacitor disposed between the n-th gate line and a high voltage source for supplying the high voltage, the method comprising:
in a first period, transmitting, to a stage configured to receive the (n−1)th gate signal of the plurality stages of the gate driver, the (n−1)th gate signal having a high level and the gate clock signal having the low level;
in a second period, transmitting, to the stage, the (n−1)th gate signal having a low level and the gate clock signal alternately repeating a high level and a low level,
wherein the first period and the second period occur alternately.

* * * * *